United States Patent
Reinmuth

(10) Patent No.: US 9,409,764 B2
(45) Date of Patent: Aug. 9, 2016

(54) MICROELECTROMECHANICAL COMPONENT AND MANUFACTURING METHOD FOR MICROELECTROMECHANICAL COMPONENTS

(71) Applicant: Robert Bosch GmbH, Stuttgart (DE)

(72) Inventor: Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/806,858

(22) Filed: Jul. 23, 2015

(65) Prior Publication Data

US 2016/0023890 A1    Jan. 28, 2016

(30) Foreign Application Priority Data

Jul. 24, 2014    (DE) .......................... 10 2014 214 525

(51) Int. Cl.
*G01L 9/00* (2006.01)
*B81B 7/00* (2006.01)
*B81C 1/00* (2006.01)

(52) U.S. Cl.
CPC ........... *B81B 7/0038* (2013.01); *B81C 1/00285* (2013.01); *B81B 2203/0127* (2013.01); *B81B 2203/0315* (2013.01); *B81B 2203/04* (2013.01)

(58) Field of Classification Search
CPC .................... B81B 7/0038; B81B 2203/0127; B81B 2203/0315; B81B 2203/04; B81C 1/00285
See application file for complete search history.

(56) References Cited

U.S. PATENT DOCUMENTS

| 8,704,238 | B2 * | 4/2014 | Yang | ................... B81C 1/00246 257/459 |
|---|---|---|---|---|
| 2005/0224714 | A1 * | 10/2005 | Akin | ......................... G01J 5/20 250/332 |
| 2007/0189558 | A1 | 8/2007 | Ogura et al. | |
| 2009/0108381 | A1 * | 4/2009 | Buchwalter | ........... B81C 1/0023 257/415 |
| 2010/0052082 | A1 | 3/2010 | Lee et al. | |
| 2010/0164025 | A1 * | 7/2010 | Yang | ................... H04R 19/005 257/416 |
| 2010/0284553 | A1 | 11/2010 | Conti et al. | |
| 2012/0237073 | A1 | 9/2012 | Goida et al. | |
| 2014/0299948 | A1 | 10/2014 | Wang et al. | |

FOREIGN PATENT DOCUMENTS

| DE | 10 30 352 | 5/1958 |
|---|---|---|
| DE | 100 65 026 | 7/2002 |
| DE | 10 2004 036 032 | 7/2005 |
| DE | 10 2004 036 035 | 7/2005 |

(Continued)

*Primary Examiner* — Shaun Campbell
(74) *Attorney, Agent, or Firm* — Norton Rose Fulbright US LLP

(57) ABSTRACT

An MEMS component includes: a substrate into which a cavity is structured from a functional top side; a buried polysilicon layer in which a polysilicon diaphragm which at least partially spans the cavity is exposed as the first electrode; an epi-polysilicon layer in which a conductive structure, which is situated at a distance above the polysilicon diaphragm by a clearance, is exposed as the second electrode; and an access opening which fluidically connects the external surroundings of the MEMS component to the cavity. At least one access channel is formed in at least one of the buried polysilicon layer, the epi-polysilicon layer, and an inner wall of the cavity of the substrate which connects the access opening to the cavity, and whose channel width is not greater than 5 μm.

4 Claims, 29 Drawing Sheets

(56) References Cited

FOREIGN PATENT DOCUMENTS

| DE | 10 2007 019 639 | 10/2008 |
|---|---|---|
| DE | 10 2013 213 071 | 10/2014 |
| EP | 1 306 348 | 5/2003 |
| EP | 1 691 570 | 8/2006 |
| EP | 2 138 450 | 12/2009 |
| WO | WO 02/02458 | 1/2002 |
| WO | WO 2012/015584 | 2/2012 |

* cited by examiner

MICROELECTROMECHANICAL COMPONENT AND MANUFACTURING METHOD FOR MICROELECTROMECHANICAL COMPONENTS

BACKGROUND OF THE INVENTION

1. Field of the Invention

The present invention relates to a microelectromechanical (MEMS) component. Moreover, the present invention relates to a manufacturing method for microelectromechanical (MEMS) components.

2. Description of the Related Art

Microelectromechanical system (MEMS) structures are used for various applications, for example for miniaturized sensors, actuators, or clock generators. These types of microelectromechanical structures may be manufactured in particular based on the so-called advanced porous silicone membrane (APSM) method, as described in the patent publication EP 1 306 348 B1, and patent application publications WO 02/02458 A1, DE 10 2004 036 032 A1, DE 10 2004 036 035 A1, EP 2 138 450 A1, DE 100 65 026 A1, or DE 100 30 352 A1, for example.

The patent application publication DE 10 2007 019 639 A1 describes a micromechanical element which includes a diaphragm made of monocrystalline silicon which is directly attached to a functional top side of a substrate for covering a cavity. An electrode is suspended at an outer side of the diaphragm facing away from the cavity. The diaphragm and the electrode are intended to be usable as sensor elements of a capacitive pressure sensor. The patent application publication DE 10 2013 213 071 provides capacitive pressure sensors having a substrate cavity beneath a buried polysilicon diaphragm, above which a free-standing electrode made of monocrystalline and polycrystalline silicon is situated.

BRIEF SUMMARY OF THE INVENTION

A first concept of the present invention is to improve a manufacturing process for a capacitive MEMS sensor device in such a way that the diaphragm components of the sensor device are protected from penetration by moisture and/or dirt particles in a rough machining operation of the wafer, from which the MEMS sensor devices are separated by sawing, for example. In this way, simple, advantageously achieved machining processes may be implemented without the risk of impairing or damaging the sensitive sensor components of the MEMS sensor devices.

The above-described advantages are also achieved with a capacitive sensor device or with a microphone which includes such a MEMS component.

A further concept of the present invention is to improve the measuring sensitivity and accuracy of MEMS sensor devices. For this purpose, it is provided that a polysilicon layer which acts as a pressure diaphragm is attached not to the substrate, but, rather, to a thick polysilicon supporting layer, situated above the substrate, which divides the polysilicon layer into multiple diaphragm sections. The polysilicon supporting layer may therefore provide support sites for the diaphragm sections, which are used for suspending the polysilicon layer. In this regard, it is particularly advantageous that the span width of the diaphragm sections of the polysilicon layer is defined with respect to the polysilicon supporting layer via contact etching, whose etching accuracy may be set particularly well. In addition, the polysilicon layer and the polysilicon supporting layer include the same base material, so that thermal distortions are able to have only minimal influence on the accuracy of the sensor devices.

Lastly, it is also a concept of the present invention to manufacture a fully differential capacitive MEMS sensor device, in which the pressure on a first diaphragm structure in a thin polysilicon layer which is fluidically connected to an outer cavity via a galvanically decoupled connection to an epi-polysilicon functional layer is transferred into a movement of a freely movable polysilicon intermediate layer. This provides the advantage that the selection of the span width of the diaphragm components in the thin polysilicon layer which absorb the pressure remains independent of the capacitance of the sensor device, as the result of which very thin diaphragm components having a smaller span width and greater manufacturing accuracy may be used, without impairing the measuring sensitivity of the sensor device. In addition, the polysilicon layer, the epi-polysilicon functional layer, and the polysilicon intermediate layer jointly provide two capacitances which operate differentially with respect to one another, so that there is no longer a need to implement a separate reference capacitance. The sensor diaphragms are also completely electrically decoupled from the measuring capacitance, so that liquids and particles which deposit on the sensor diaphragms from the outside are not able to produce short circuits or generate interference signals.

The described embodiments and refinements may be arbitrarily combined with one another if this is meaningful. Further possible embodiments, refinements, and implementations of the present invention also include combinations, even if not explicitly stated, of features of the present invention which are described above or below with regard to the exemplary embodiments.

The appended drawings are intended to impart further understanding of the specific embodiments of the present invention. The drawings illustrate specific embodiments, and are used in conjunction with the description to explain principles and concepts of the present invention. Other specific embodiments and many of the mentioned advantages result with regard to the drawings. The elements of the drawings are not necessarily shown true to scale relative to one another. Directional terms such as "left," "right," "top," "bottom," "above," "below," "next to," "in front of," "behind," "vertical," "horizontal," "lateral," or the like are used in the following description solely for purposes of explanation, and do not represent a limitation of generality.

DETAILED DESCRIPTION OF THE INVENTION

Figure 1:
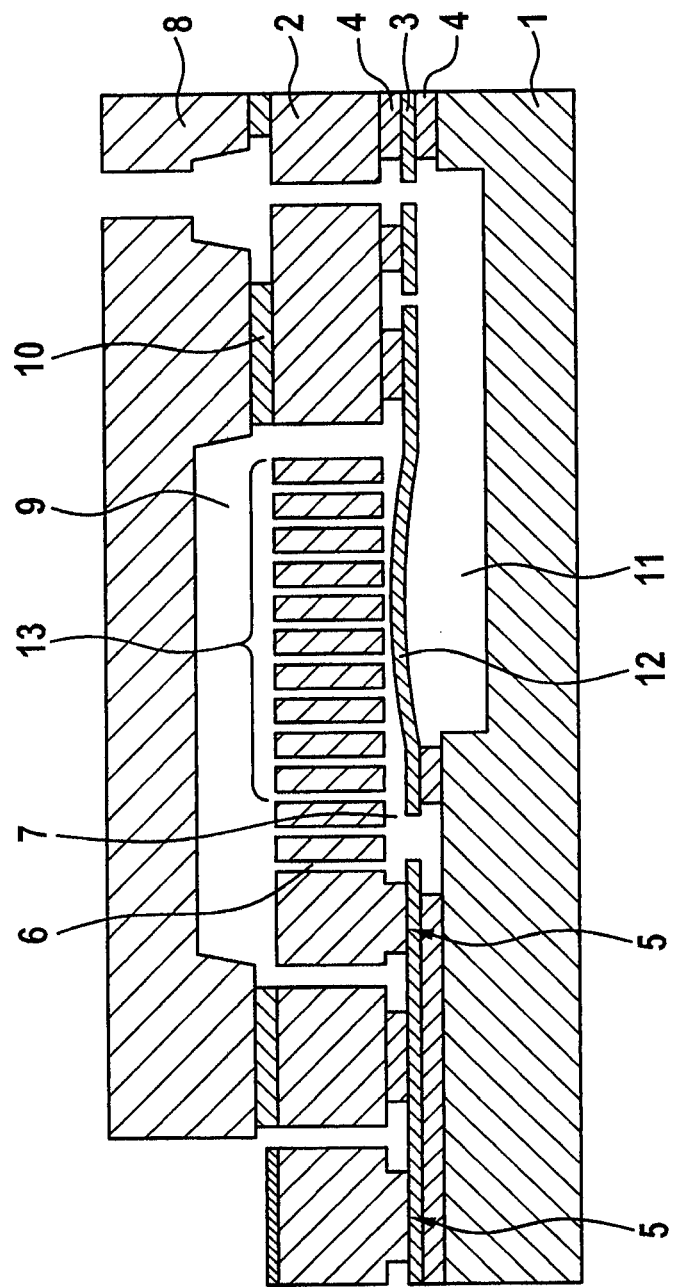
FIG. 1 shows a schematic sectional view of an example of a MEMS component.

FIG. 1 shows a schematic sectional view of an example of a MEMS component. An at least partially conductive polysilicon diaphragm 12, with the aid of which a cavity 11 which is structured into a functional top side of a substrate 1 is at least partially spanned, is exposed in a buried polysilicon layer 3. Cavity 11 is preferably completely spanned by the at least partially conductive diaphragm. Substrate 1 may include, for example, a semiconductor material such as silicon. Substrate 1 may in particular be a semiconductor substrate, for example a silicon substrate. However, it is pointed out that the practicability of the manufacturing method described below is not limited to a specific material of substrate 1.

Known etching processes may be carried out for structuring cavity 11 into substrate 1. For example, for the etching process of cavity 11, a protective layer may be applied to substrate surfaces which are not to be etched. A thick epi-polysilicon layer 2 may be situated on substrate 1, above a thin buried polysilicon layer 3. Buried polysilicon layer 3 is electrically conductive, and is used for transporting electrical charge and/or as an electrode. Oxide layers 4 may be formed between substrate 1 and buried polysilicon layer 3, and optionally between buried polysilicon layer 3 and epi-polysilicon layer 2, the oxide layers separating the particular layers from the adjacent layers in an electrically insulating manner. Contact areas 5 made of polysilicon or some other electrically conductive material may optionally be provided in oxide layers 4 at suitable or desired locations.

Epi-polysilicon layer 2 is used as a functional layer in which a conductive structure as an electrode 13 is exposed, for example via circumferential trenches 6, and which is situated at a distance above polysilicon diaphragm 12 by a clearance 7. Clearance 7 in the oxide layer may be formed via a sacrificial layer process, for example, while the structuring of epi-polysilicon layer 2 may take place via trench processes, for example.

Polysilicon diaphragm 12 as a first electrode and electrode structure 13 in epi-polysilicon layer 2 may be hermetically enclosed with a cap wafer 8 made of silicon, for example, using suitable bond layers 10. Cap wafer 8 is used on the one hand for mechanically protecting against outside influences on sensitive polysilicon diaphragm 12 and electrode structures 13. On the other hand, a definable pressure, which may be used as a reference pressure for the MEMS pressure sensor device formed by polysilicon diaphragm 12 and electrode structure 13, is settable in cavity 9 beneath cap wafer 8.

A pressure access through buried polysilicon layer 3, epi-polysilicon layer 2, and cap wafer 8 which fluidically connects cavity 11 to the outside atmosphere is apparent on the right side of FIG. 1. The reference pressure enclosed in cavity 9 provides a neutral value with respect to the external pressure, which is used as a reference for the change in capacitance when polysilicon diaphragm 12 deflects with respect to electrode structure 13. The pressure present on the outside and the pressure prevailing in cavity 11 may thus be deduced via the measurable change in capacitance.

Since opening of cavity 11 frequently takes place using a sawing process C with water flushing, moisture and debris particles resulting from the sawing may enter into the area of exposed polysilicon diaphragm 12, and may contaminate or even destroy it. Even in dry separation processes such as laser-assisted separation processes, dirt and debris particles may result which may have an adverse effect on the integrity of the pressure sensor device.

Figure 2:
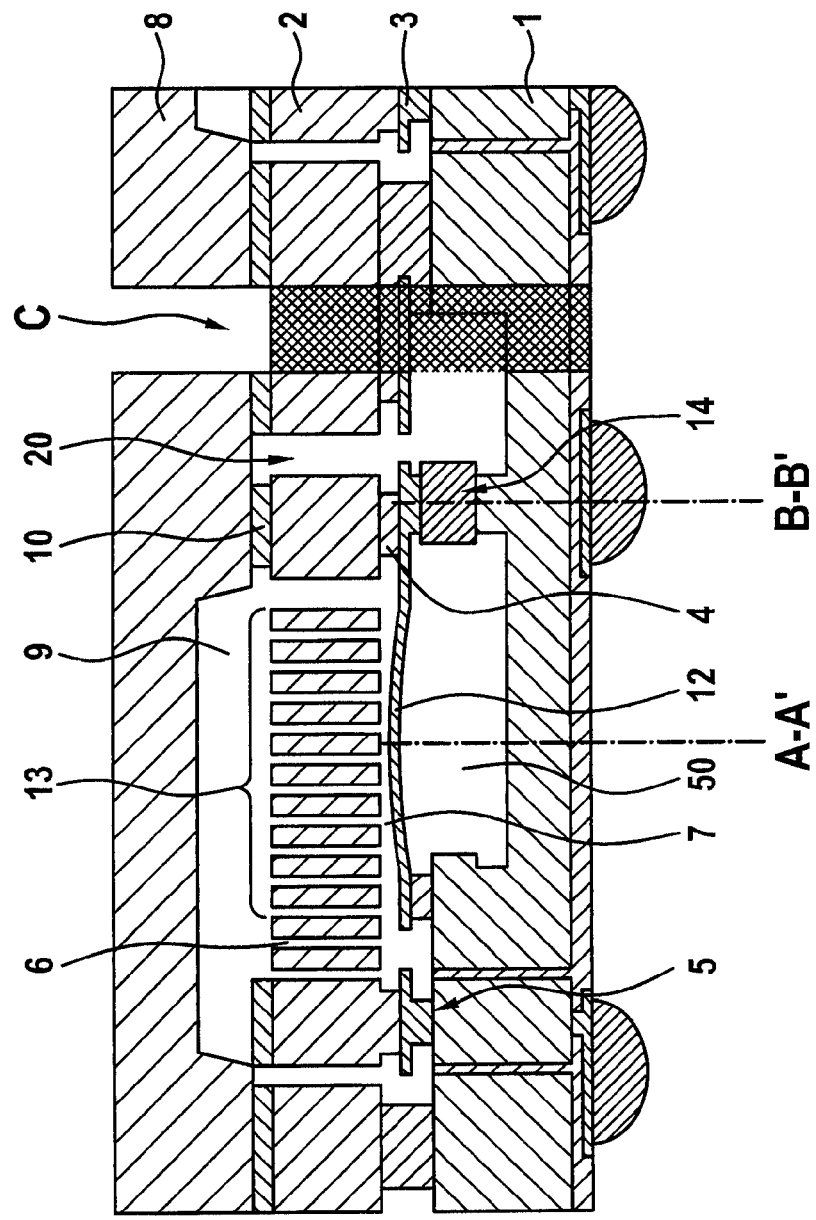
FIG. 2 shows a schematic sectional view of a MEMS component according to a first specific embodiment of the present invention.
Figure 3:
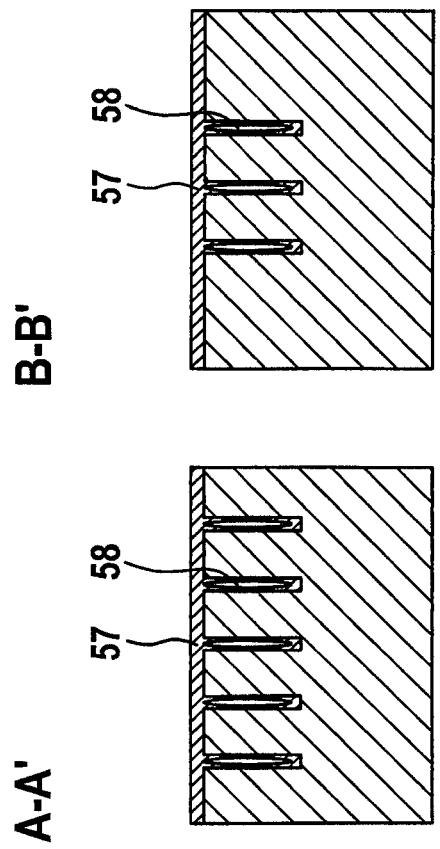
FIG. 3 shows schematic views of various cross sections of a precursor of the MEMS component in FIG. 2.
Figure 4:
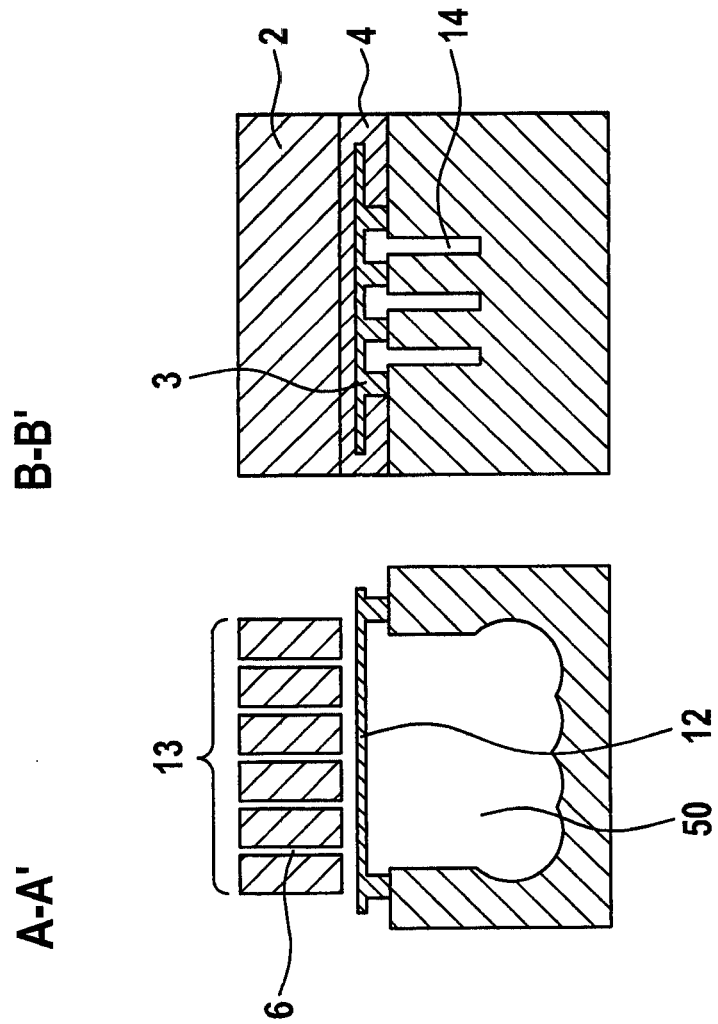
FIG. 4 shows schematic views of various cross sections of the MEMS component in FIG. 2.

As illustrated in FIG. 2, one or multiple access channels 14 may therefore be formed in an inner wall of a cavity 50 of substrate 1, which connect (s) an access opening 20 to cavity 50. The channel width of access channels 14 is not greater than 5 μm, thus preventing or at least greatly impeding the penetration of liquids, moisture, and/or foreign particles. Access channels 14 may be, for example, slits in substrate 1, whose production is illustrated as an example in FIGS. 3 and 4. FIGS. 3 and 4 each show sectional views along longitudinal sections A-A' and B-B' indicated in FIG. 2.

For this purpose, trenches are provided in the substrate wall and are filled with an oxide layer 57. The trenches in section line A-A' are the basis for shaping the cavity, but in section line B-B' are the basis for shaping access channels 14. However, all trenches together with oxide layer 57 may advantageously be formed in the same process step. The trenches and oxide layer 57 may preferably be designed in such a way that a cavity 58 remains in the middle of the trenches after the oxide is deposited. This may be achieved in particular when the trenches have an aspect ratio of at least 1:4, or the trench profile is intentionally designed with a slight overhang. The trenches have a maximum width of 5 μm.

As shown in FIG. 4, the substrate material for forming cavity 50 may be subsequently etched beneath the polysilicon diaphragms. No etching step takes place in the area of the trenches provided for forming the access channels. The standard MEMS process may be subsequently carried out, which covers the narrow webs with a MEMS layer which is present.

The subsequent oxide sacrificial etching step may be carried out in the area of cavity 50 and also in the area of access channels 14, preferably via an external access to cavity 50 which functions as etching access. In the process, oxide layer 17 for exposing access channels 14, and subsequently oxide layer 17, are etched at the cavity trenches. Both etching operations may advantageously be carried out in the same oxide sacrificial etching step. A water-repellent layer, for example an organic fluorine-containing layer, may be subsequently applied to the inner walls of exposed access channels 14.

Alternatively, oxide layer 17 in cavity 50 may also be etched out via a separate oxide sacrificial etching step. This may take place in particular after the MEMS components are separated from a wafer. Polysilicon diaphragm 12 is thus protected by oxide layers 17 during the separation process. The access channels may also be further opened after oxide layer 17 is removed, thus ensuring a more rapid pressure compensation while still providing sufficient protection against liquids and particles.

Figure 5:
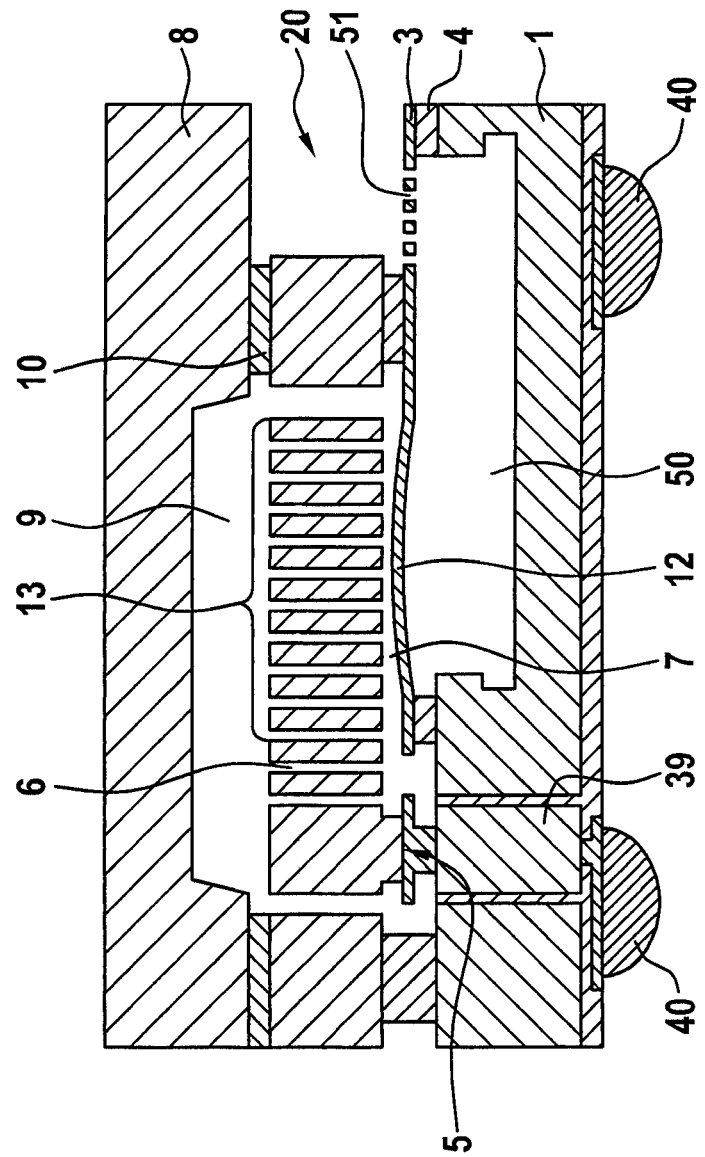
FIG. 5 shows a schematic sectional view of a MEMS component according to a second specific embodiment of the present invention.
Figure 6:
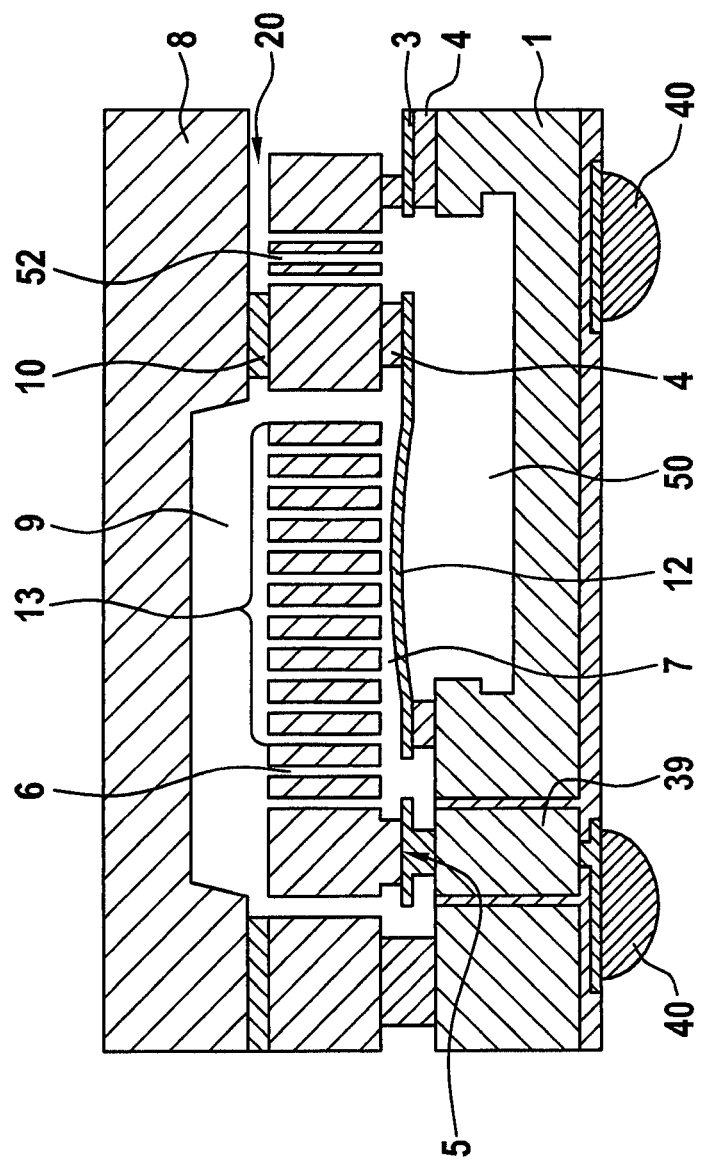
FIG. 6 shows a schematic sectional view of a MEMS component according to a third specific embodiment of the present invention.

As shown in FIGS. 5 and 6, instead of access channels 14 in the substrate cavity wall of cavity 50, access channels 51 may be formed in buried polysilicon layer 3, or access channels 52 may be formed in epi-polysilicon layer 2. In both cases, access opening 20 is thus separated from substrate cavity 50 with repellence of liquids and particles.

In each design, access channels 14, 51, or 52 may also be curved or angled along their course in buried polysilicon layer 3, epi-polysilicon layer 2, or inner wall of cavity 50 of substrate 1. This also prevents extremely small particles from being able to gain direct access into the area of cavity 50.

In the sawing process, with access channels 14, 51, and 52 it is not possible for either water or foreign or debris particles to penetrate into the area of cavity 50 of substrate 1, and thus, to the bottom side of polysilicon diaphragm 12. Due to the water-repellent layer, the wetting and creep effects of moisture in access channels 14, 51, and 52 are also reduced. MEMS components based on the specific embodiments provided in FIGS. 1 through 6 may thus be manufactured very easily and cost-effectively using known process flows. In particular, simple sawing processes are possible without endangering the integrity of the sensitive components of the MEMS components. Polysilicon diaphragm 12 also remains protected from penetration of moisture and particles during use or operation. In addition, the shock load on polysilicon diaphragm 12 during operation is reduced, since shock waves in liquids or acoustic pressure waves are greatly damped by the access channels.

Depending on the design, pressure sensors may have natural frequencies which are in the acoustic range. When access channels 14, 51, and 52 are dimensioned, i.e., have a narrowness and length, in such a way that via the gas damping at the inlet openings only very low-frequency vibrations pass through to polysilicon diaphragm 12, on the basis of the MEMS components in FIGS. 1 through 7, pressure sensors having natural frequencies in the acoustic range may also advantageously be used.

Figure 7:
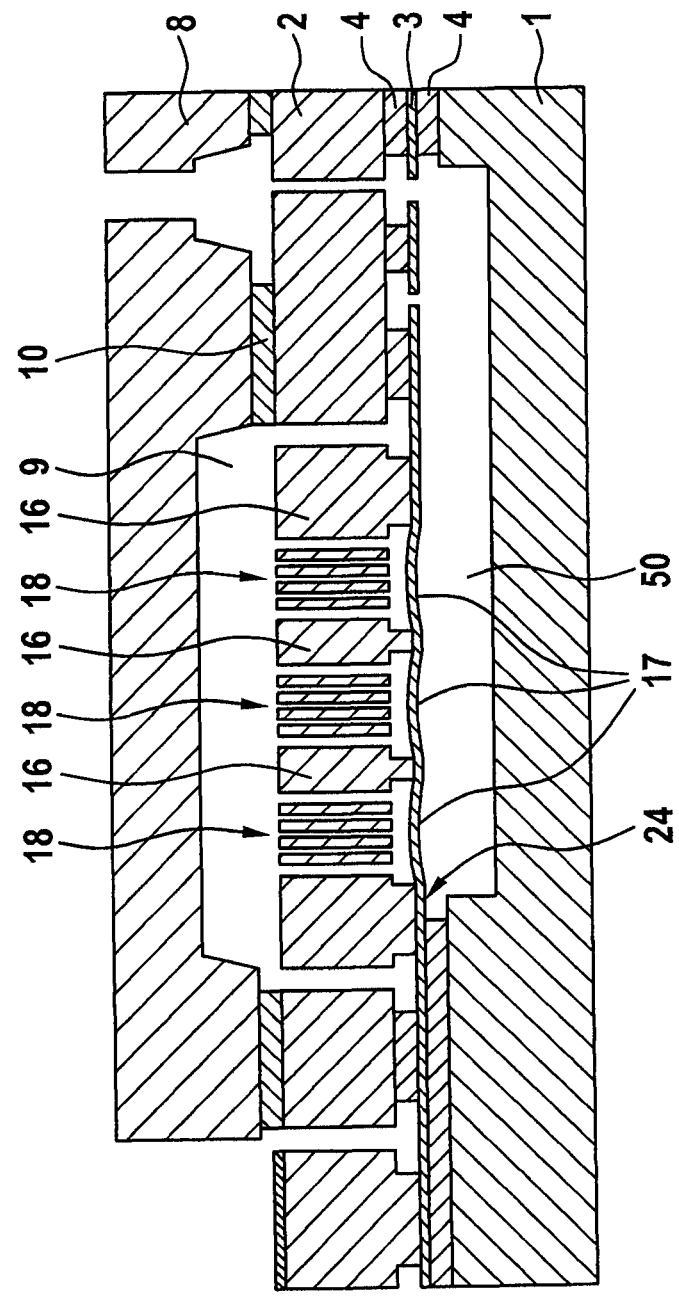
FIG. 7 shows a schematic sectional view of an example of a MEMS component.

FIG. 7 shows a MEMS component which includes a substrate 1 into which a cavity 50 is structured from a functional top side. Pressure access takes place on the side via an access opening or a substrate opening on the rear side. A buried polysilicon layer 3 is applied to substrate 1 via an oxide layer 4, and in the area of cavity 50 is exposed as at least one polysilicon diaphragm 17 which at least partially spans cavity 50. Polysilicon diaphragm 17 functions as a first electrode of a capacitive pressure sensor device. Polysilicon diaphragm 17 is suspended on an epi-polysilicon layer 2 which is situated thereabove in an electrically insulating manner and optionally separated at a distance by a further oxide layer. For this purpose, epi-polysilicon layer 2 includes on the one hand a first conductive structure 18 as a second electrode, and on the other hand, a second structure 16 which is electrically insulated from first conductive structure 18. First conductive structure 18 is exposed at a distance above the at least one polysilicon diaphragm 17 by a clearance 7. Second structure 16 is used as a suspension for polysilicon diaphragm 17.

As illustrated in FIG. 7, multiple sections of polysilicon diaphragms 17 may be formed which at the edges are connected to second structure 16. Second structures 16 are thus used as support structures for polysilicon diaphragms 17. Due to the electrical insulation of the first structures from the second structures in epi-polysilicon layer 2, it is possible to measure a change in capacitance when polysilicon diaphragms 17 move in the direction of first electrodes 18.

Polysilicon diaphragms 17 of MEMS component in FIG. 7 are no longer connected to substrate 1. Therefore, their span width is also no longer determined by the effects of a time-controlled oxide etching process, whose accuracy is very limited for process-related reasons. Since the sensitivity of the MEMS pressure sensor device is a function of the span width of polysilicon diaphragms 17 to the third power, the pressure sensitivity and measuring accuracy of the MEMS component in FIG. 7 may be significantly improved. Due to the fact that multiple sections of polysilicon diaphragms 17 may be formed and exposed above the same cavity 50, the effective capacitance of the pressure sensor device of the MEMS component may be greatly increased without having to resort to a larger substrate surface.

Outwardly applied bending of the MEMS component results in only minor bending of polysilicon diaphragms 17, since epi-polysilicon layer 2 and buried polysilicon layer 3 are made of identical materials, or at least of materials which are very similar in their mechanical bending behavior. In addition, the temperature dependency of the pretensioning of polysilicon diaphragms 17 is greatly reduced in this way.

Figure 8:
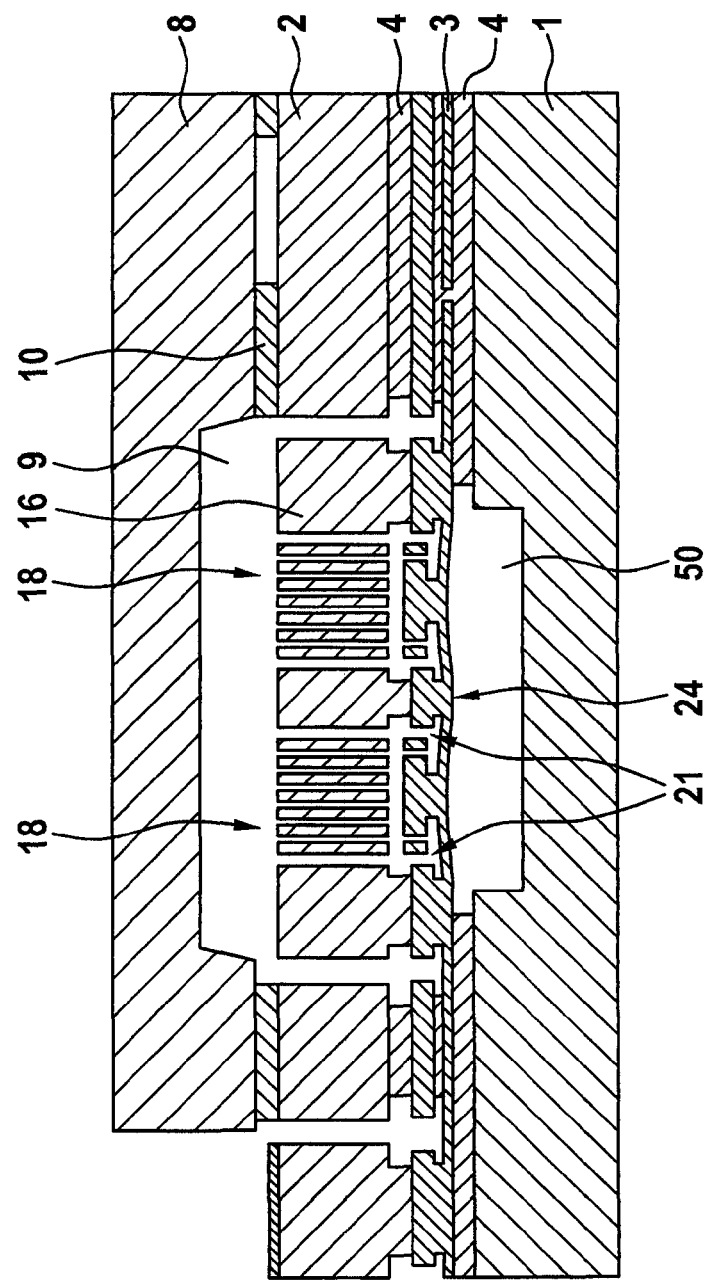
FIG. 8 shows a schematic sectional view of an example of a MEMS component.
Figure 9:
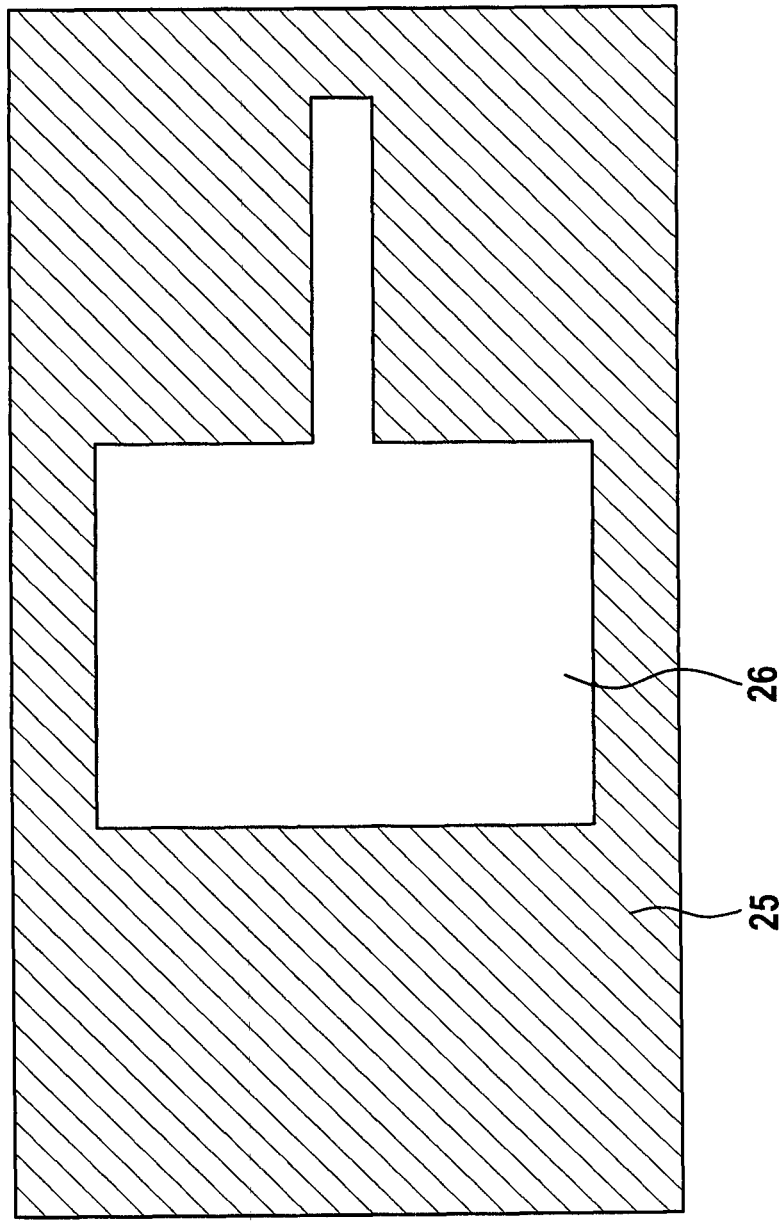
FIG. 9 shows a first manufacturing step of an example of a manufacturing method for a MEMS component.
Figure 10:
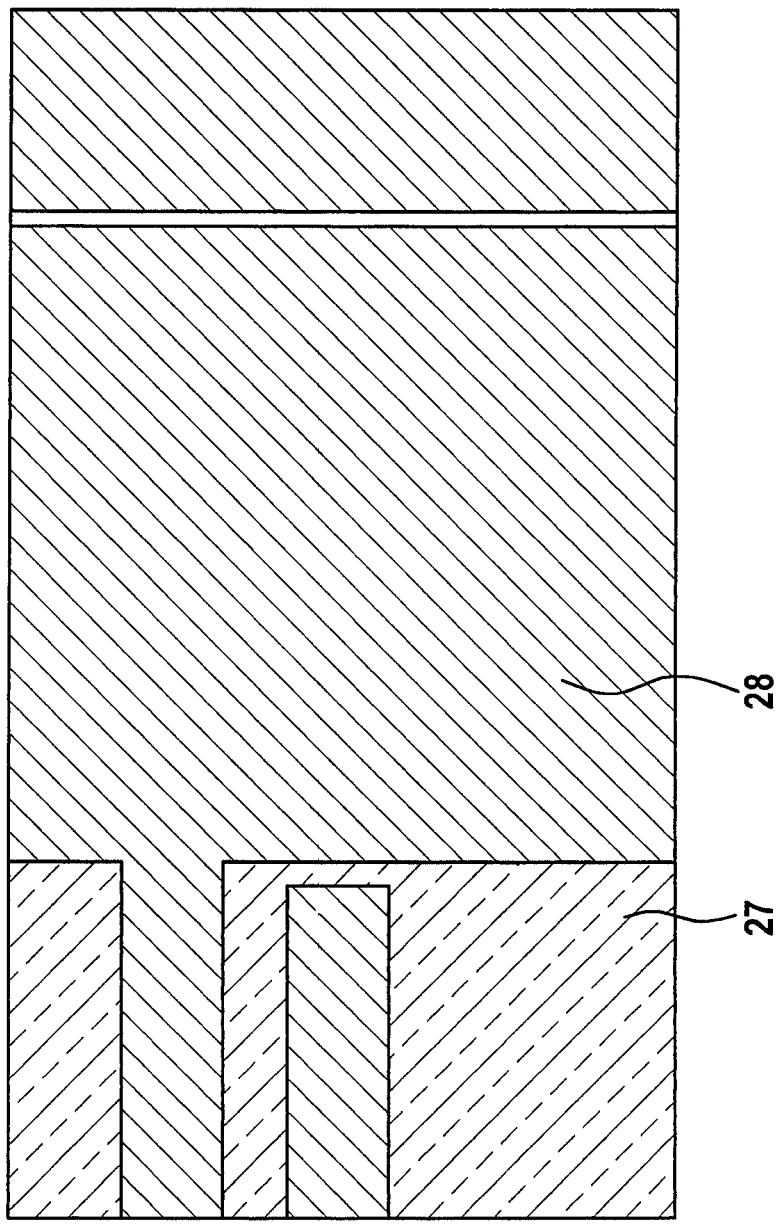
FIG. 10 shows a second manufacturing step of an example of a manufacturing method for a MEMS component.
Figure 11:
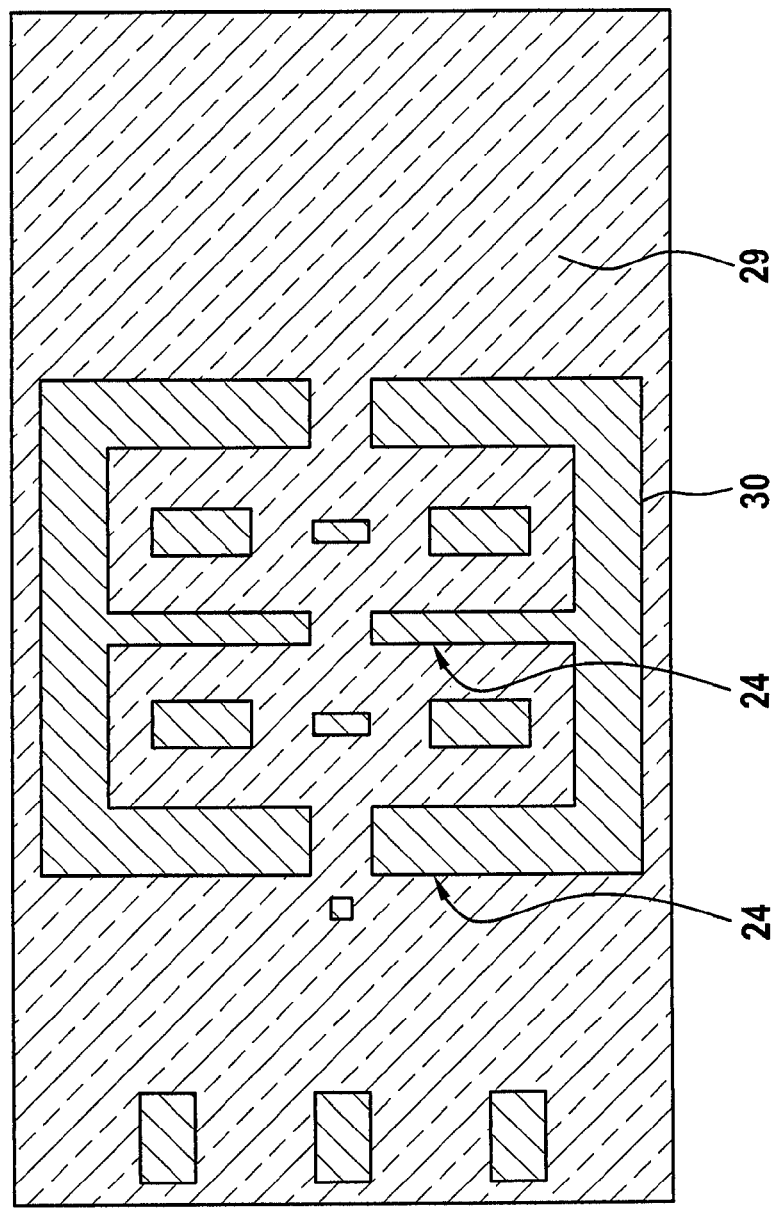
FIG. 11 shows a third manufacturing step of an example of a manufacturing method for a MEMS component.
Figure 12:
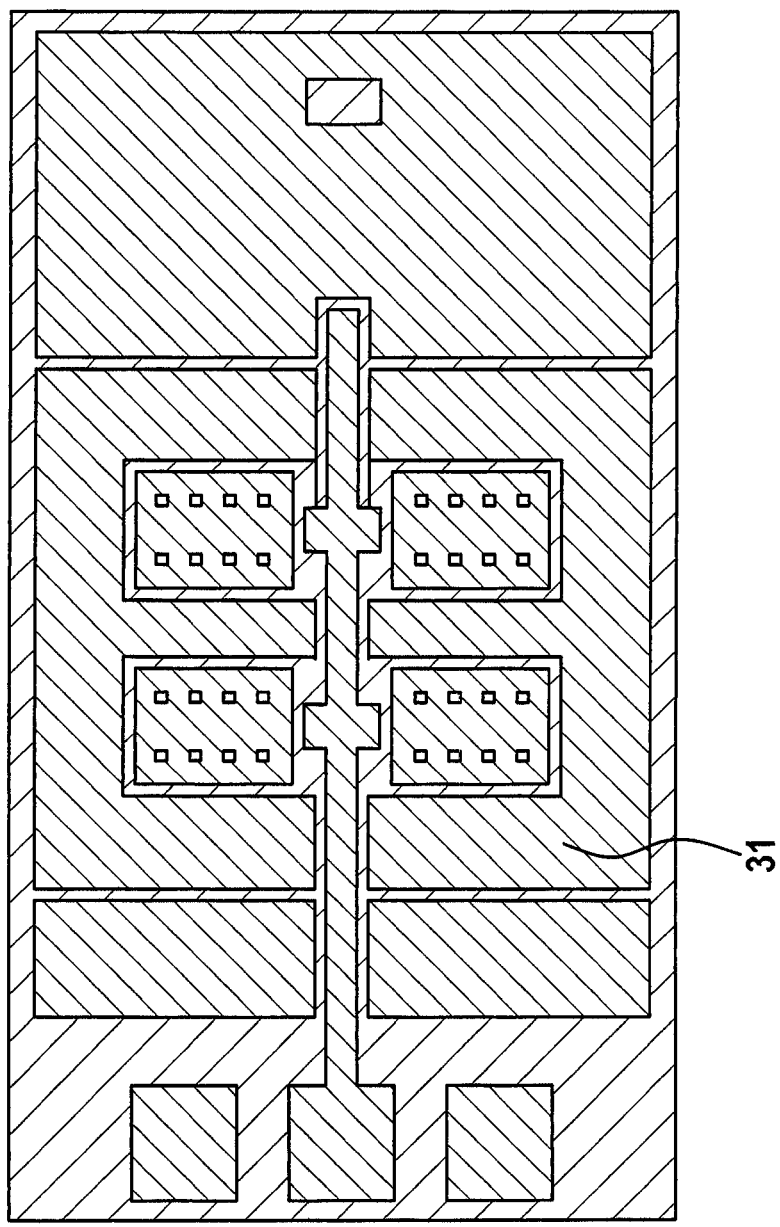
FIG. 12 shows a fourth manufacturing step of an example of a manufacturing method for a MEMS component.
Figure 13:
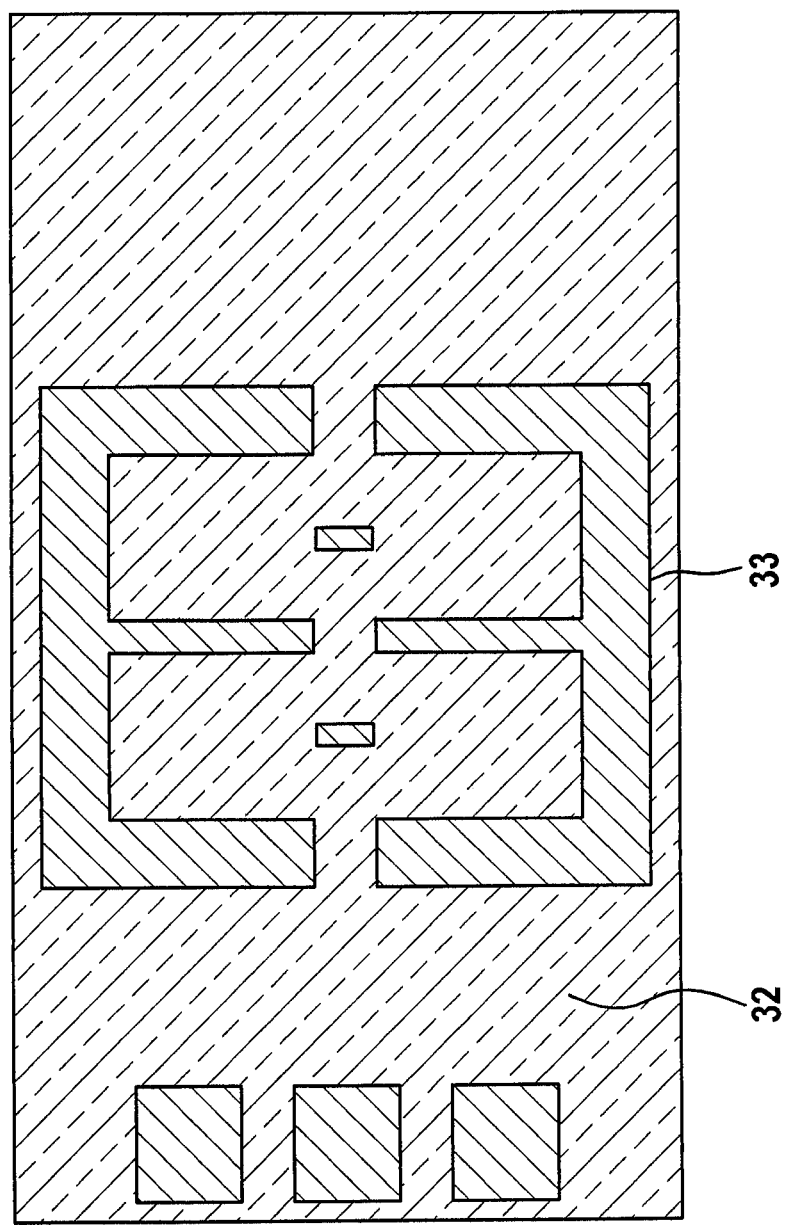
FIG. 13 shows a fifth manufacturing step of an example of a manufacturing method for a MEMS component.
Figure 14:
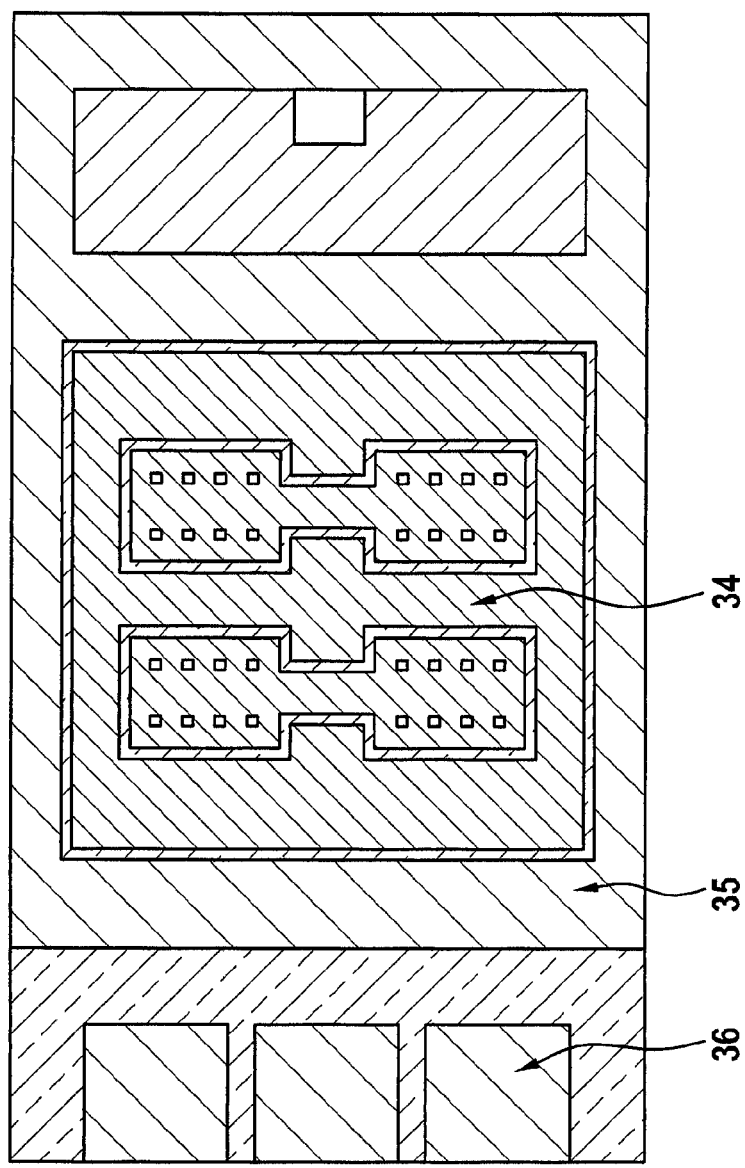
FIG. 14 shows a sixth manufacturing step of an example of a manufacturing method for a MEMS component.
Figure 15:
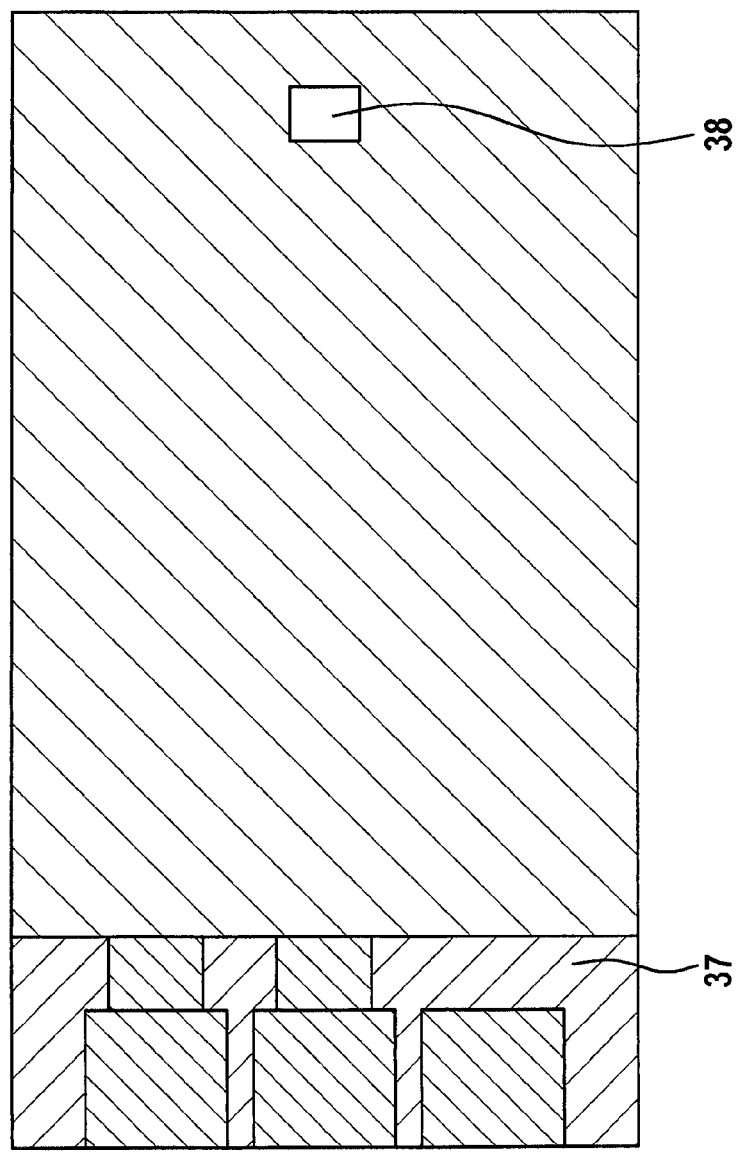
FIG. 15 shows a seventh manufacturing step of an example of a manufacturing method for a MEMS component.

As illustrated in FIG. 8, it may be advantageous to provide a polysilicon intermediate layer 19 which is situated between buried polysilicon layer 3 and epi-polysilicon layer 2. One or multiple reinforcing structures 20 which is/are coupled to the at least one polysilicon diaphragm 17 may be formed in polysilicon intermediate layer 19. Partial areas of polysilicon diaphragms 17 may advantageously be reinforced with polysilicon intermediate layer 19, so that overall, diaphragms having a greater span width may be produced. Polysilicon intermediate layer 19 may also protrude beyond polysilicon diaphragms 17 in edge areas 21, so that the capacitive measuring signal in the edge areas is increased.

In addition, the electrode structures may be suspended above polysilicon intermediate layer 19, so that also the electrodes in epi-polysilicon layer 2 are decoupled from substrate 1.

Figure 16:
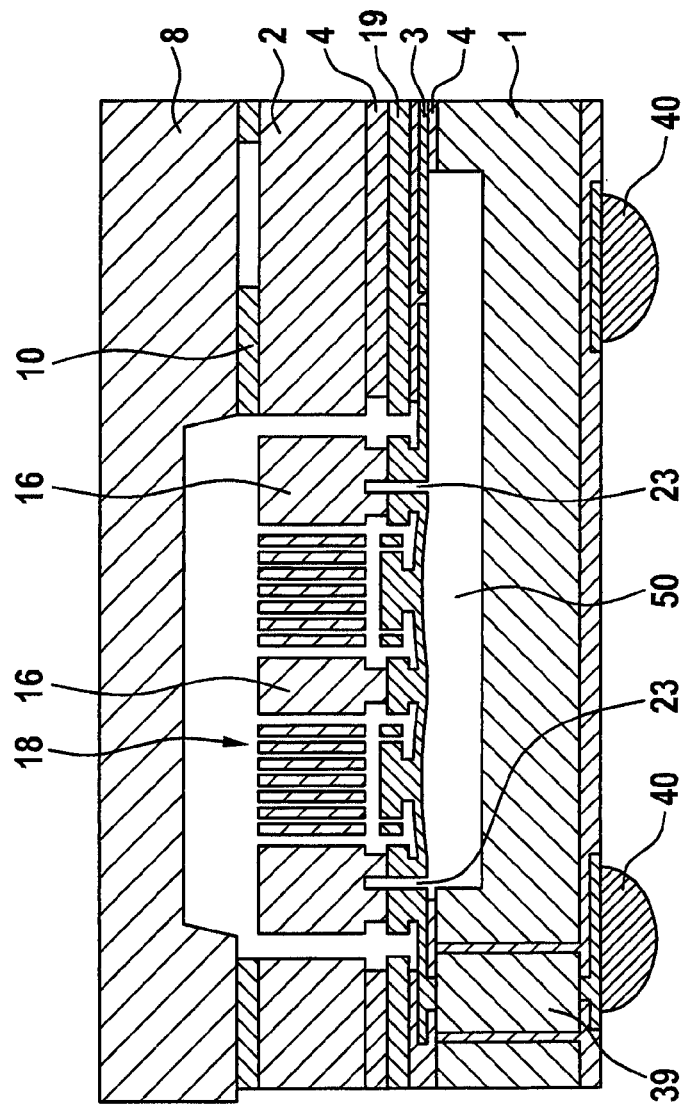
FIG. 16 shows a schematic sectional view of an example of a MEMS component.
Figure 17:
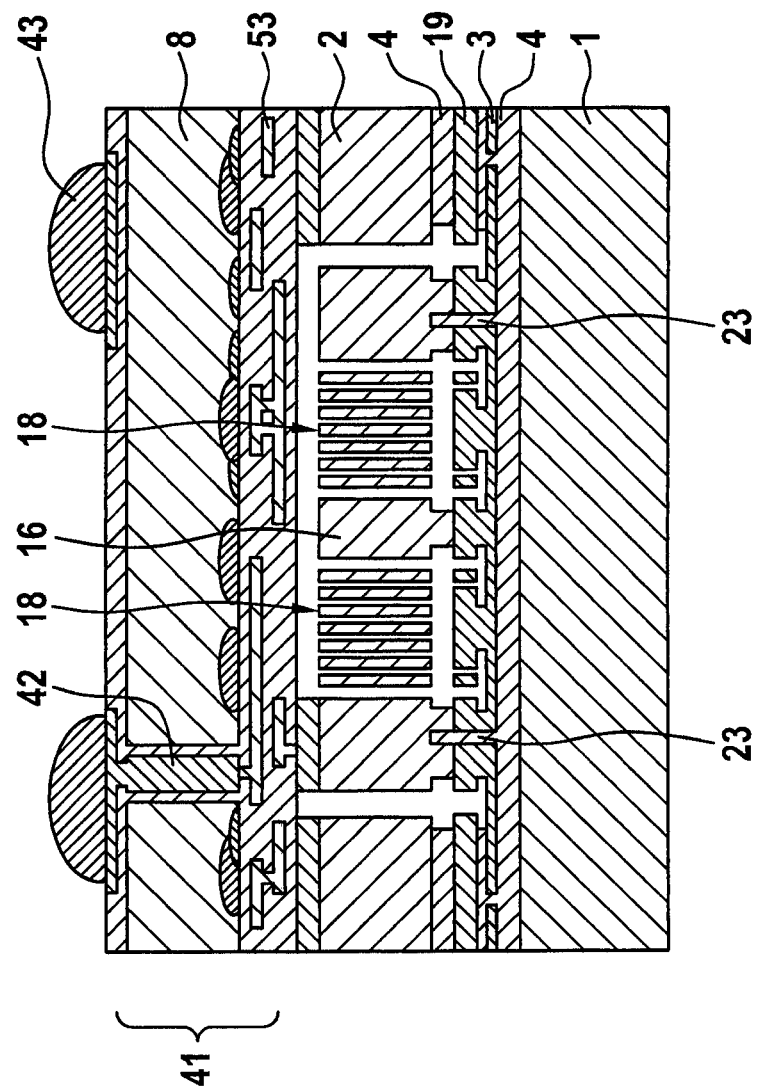
FIG. 17 shows a schematic sectional view of a precursor of an example of a MEMS component.

FIG. 16 shows one variant of the MEMS component in FIG. 8, in which vias 39 (through silicon vias (TSVs)) are formed through substrate 1 for contacting via flip-chip contacts 40. Trenches 23 are introduced through polysilicon intermediate layer 19 up to second structures 16, so that polysilicon diaphragms 17 are better mechanically decoupled from the remainder of polysilicon intermediate layer 19. FIG. 17 shows one variant of the MEMS component in FIG. 8, in which cap wafer 8 directly includes an integrated circuit 41 as an evaluation circuit for the sensor device. Cap wafer 8 has vias 42 (through silicon vias (TSVs)) through the cap substrate which are designed with flip-chip contacts 43.

Figure 18:
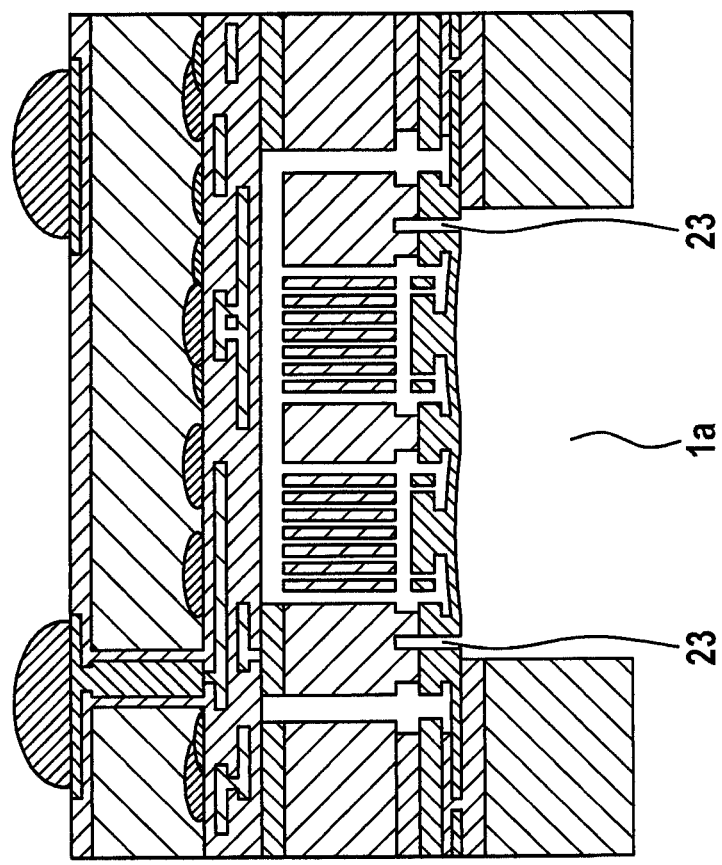
FIG. 18 shows a schematic sectional view of the example of the MEMS component.

Appropriate metal plating levels 53 may be provided in the connecting oxide layers of cap wafer 8 and epi-polysilicon layer 2. FIG. 18 shows one variant of the MEMS component in FIG. 17, in which substrate 1 has been etched on the rear side to form an access opening 1a, and oxide layers 4 have been removed. The oxide layers may be removed via anisotropic plasma processes, so that undercuts of the oxide may be avoided.

FIGS. 9 through 15 show machining stages of a manufacturing process for a MEMS component according to one of FIG. 8, 16, 17, or 18. A substrate cavity 26 on which base oxide 27 and a thin polysilicon layer 28 are applied is introduced into a substrate 25. Contact openings 30 are formed in an intermediate oxide layer 29 which is applied to thin polysilicon layer 28. A polysilicon intermediate layer 31 is once again deposited thereon, on which a further intermediate oxide layer 32 having contact openings 33 is formed. A thick polysilicon layer 34 on further intermediate oxide layer 32 includes bond areas 35 and contact areas 36, so that a cap which includes contacts 37 and pressure access openings 38 may be formed on thick polysilicon layer 34.

Figure 19:
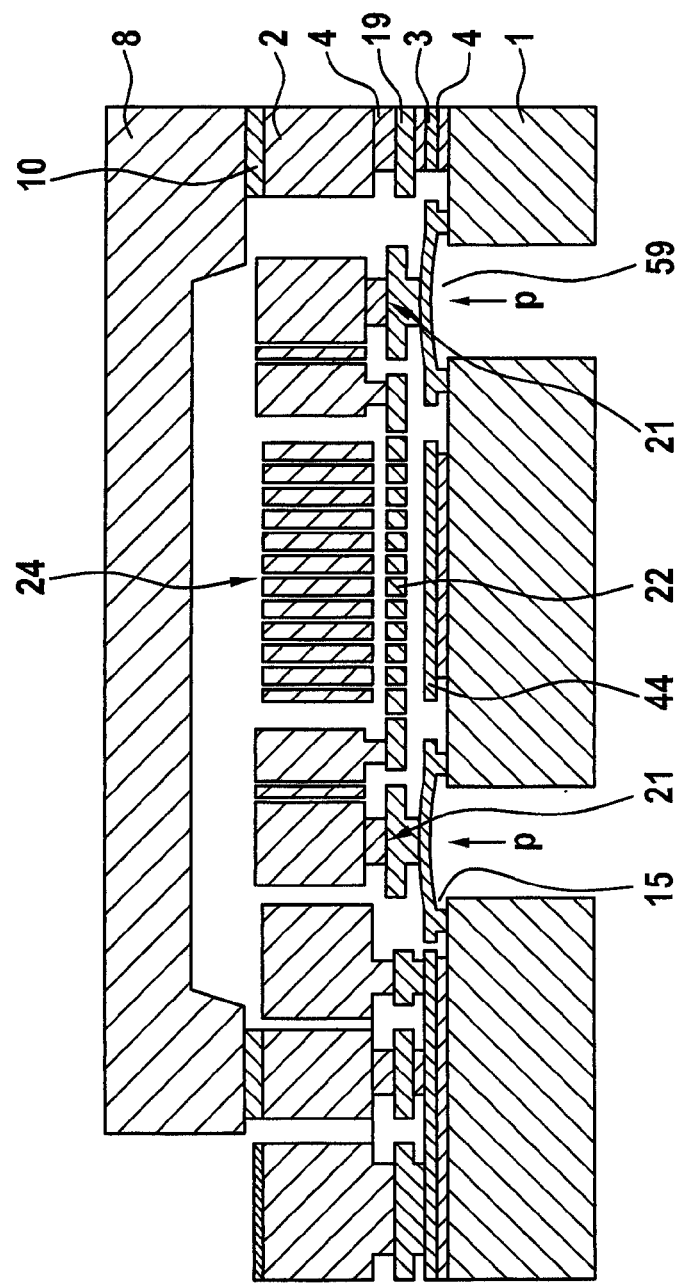
FIG. 19 shows a schematic sectional view of an example of a MEMS component.

FIG. 19 shows a schematic sectional illustration of a MEMS component which includes a substrate 1 into which a recess is structured from a functional top side. A buried polysilicon layer 3 in which at least one polysilicon diaphragm 15 is exposed includes a first electrode 44 which is structured from polysilicon layer 3 and connected to substrate 1 via an oxide layer 4. An epi-polysilicon layer 2 in which a first conductive structure 24 as a second electrode is exposed is situated above buried polysilicon layer 3. The second electrode is situated at a distance from first electrode 44 by a clearance. Epi-polysilicon layer 2 also includes a second structure, electrically insulated from first conductive structure 24, which is used as a suspending structure for an intermediate electrode structure 22 in an polysilicon intermediate layer 19. Polysilicon intermediate layer 19 is situated between buried polysilicon layer 3 and epi-polysilicon layer 2, and includes a reinforcing structure 20 which is formed in polysilicon intermediate layer 19 and is coupled to the at least one polysilicon diaphragm 15. Intermediate electrode structure 22 is suspended on the second structure of epi-polysilicon layer 2, and is situated in the clearance between second electrode 24 and first electrode 44.

Intermediate electrode structure 22 is thus freely movable and electrically separated from substrate 1 via an insulation layer 21. Polysilicon diaphragms 15 are thickened at individual locations via polysilicon intermediate layer 19, so that areas in the diaphragm are defined which are able to deflect strongly upon a pressure action p from the outside, for example via a pressure access opening in substrate 1 on the rear side. The deflection of polysilicon diaphragms 15 is transmitted via the suspending structure in epi-polysilicon layer 2 to intermediate electrode structure 22, which is able to move with respect to the two electrode structures situated below and above when the pressure on polysilicon diaphragms 15 changes. A fully differential capacitive measuring signal for the pressure change may thus be ascertained via electrode structures 44 and 24.

Figure 20:
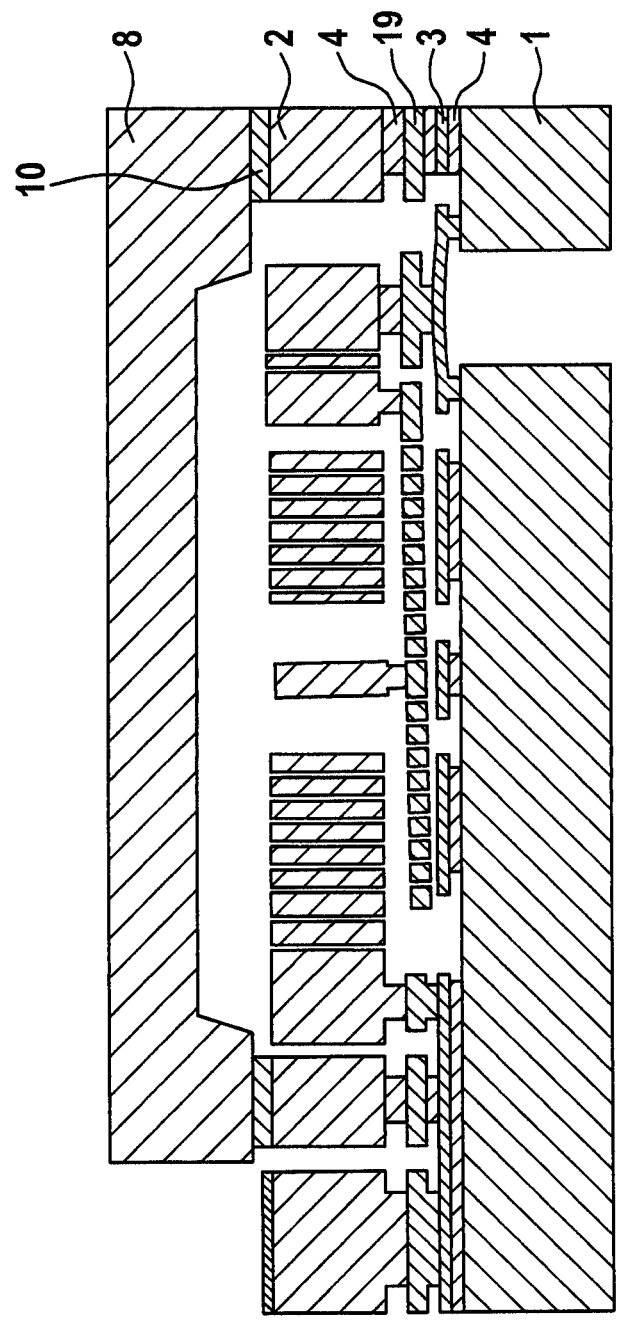
FIG. 20 shows a schematic sectional view of an example of a MEMS component.

As shown in FIG. 20 as a variant, the intermediate electrode structure may also be designed as a tiltable structure which is twistably suspended on an intermediate structure of epi-polysilicon layer 2 in the middle, and which may be actuated via an individual polysilicon diaphragm 15 at an edge with the aid of the suspending structure in polysilicon intermediate layer 19.

Figure 27:
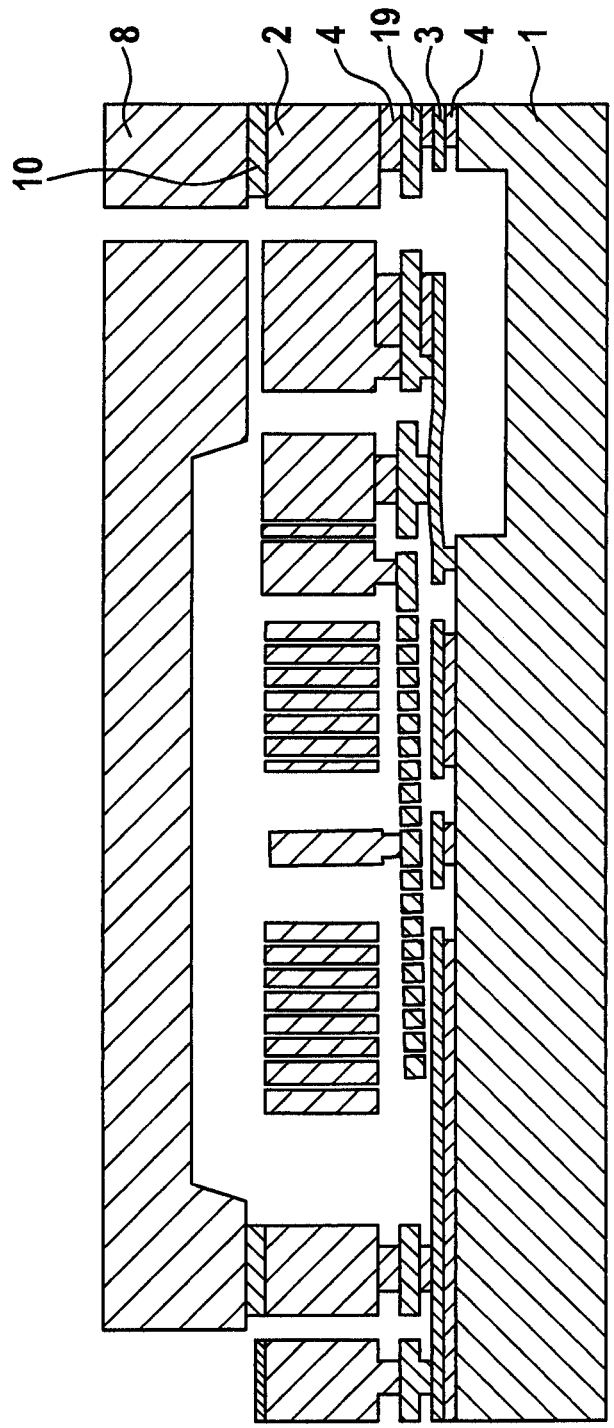
FIG. 27 shows a schematic sectional view of an example of a MEMS component.
Figure 28:
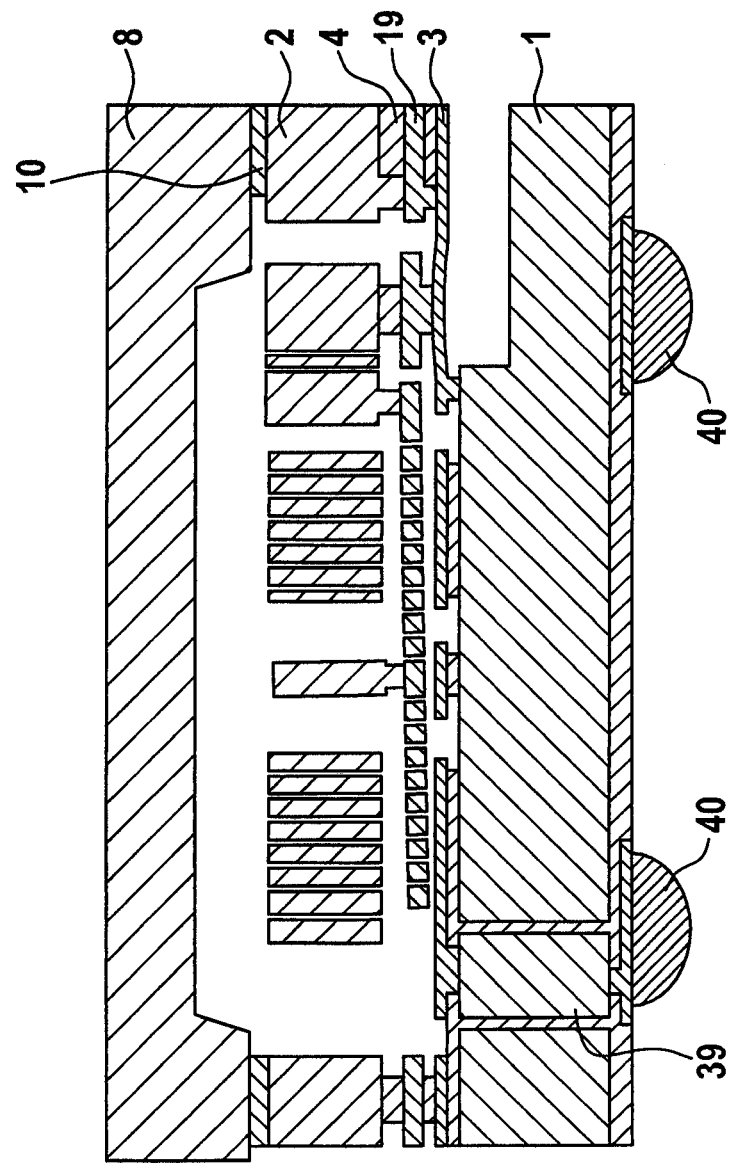
FIG. 28 shows a schematic sectional view of an example of a MEMS component.
Figure 29:
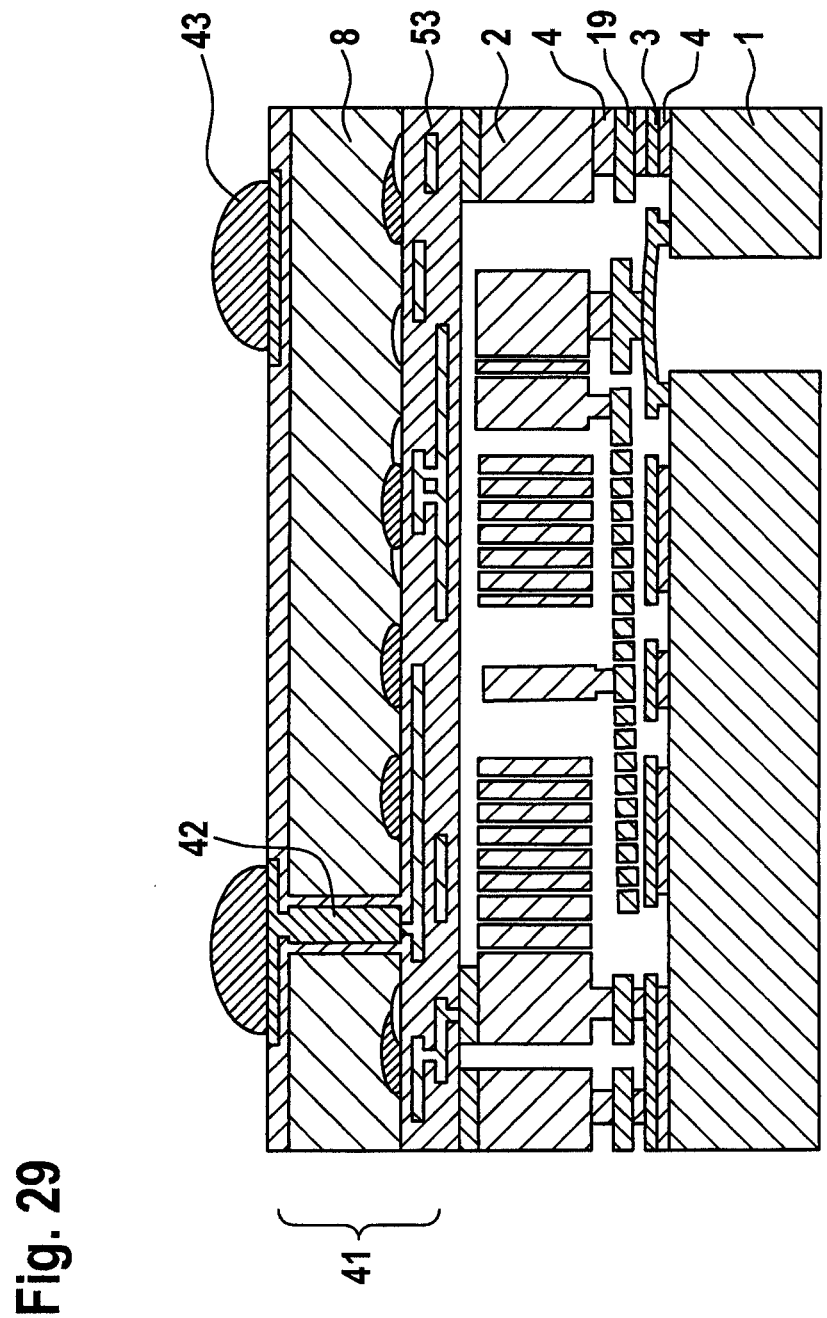
FIG. 29 shows a schematic sectional view of an example of a MEMS component.

FIGS. 27, 28, and 29 each show advantageous variants of the MEMS components in FIGS. 19 and 20. In FIG. 27, pressure access 17 on the front side is provided through cap wafer 8 and epi-polysilicon layer 2 toward the pressure cavity in substrate 1. FIG. 28 shows an embodiment variant which includes vias 39 (through silicon vias (TSVs)) which are formed through substrate 1 for contacting via flip-chip contacts 40, pressure access taking place via a lateral access channel 16 in substrate 1. FIG. 29 shows one variant of the MEMS component in which cap wafer 8 directly includes an integrated circuit 41 as an evaluation circuit for the sensor device. Cap wafer 8 has vias 42 (through silicon vias (TSVs)) through the cap substrate which are designed with flip-chip contacts 43. Appropriate metal plating levels may be provided in the connecting oxide layers of cap wafer 8 and epi-polysilicon layer 2.

The advantages of the shown embodiment variants are essentially that the span width of polysilicon diaphragms 15 is determined not by a time-controlled etching process, but, rather, by a defined connection in polysilicon intermediate layer 19. The span width may thus be set very accurately. In addition, polysilicon diaphragms 15 are no longer directly coupled to the capacitance of the sensor device, so that very thin polysilicon diaphragms 15 having a small span width may be used without having to dispense with capacitance volumes of the sensor device. The sensor device of the MEMS components in FIGS. 19, 20, 27, 28, and 29 operates differentially, so that a reference capacitance is no longer required and the measuring signal remains very sensitive. Polysilicon diaphragms 15 are also electrically decoupled from the measuring capacitances. As a result, media, liquids, or foreign particles which deposit or accumulate on polysilicon diaphragms 15 which are accessible from the outside no longer cause interference with the measuring signals at electrode structures 23, 24.

Figure 21:
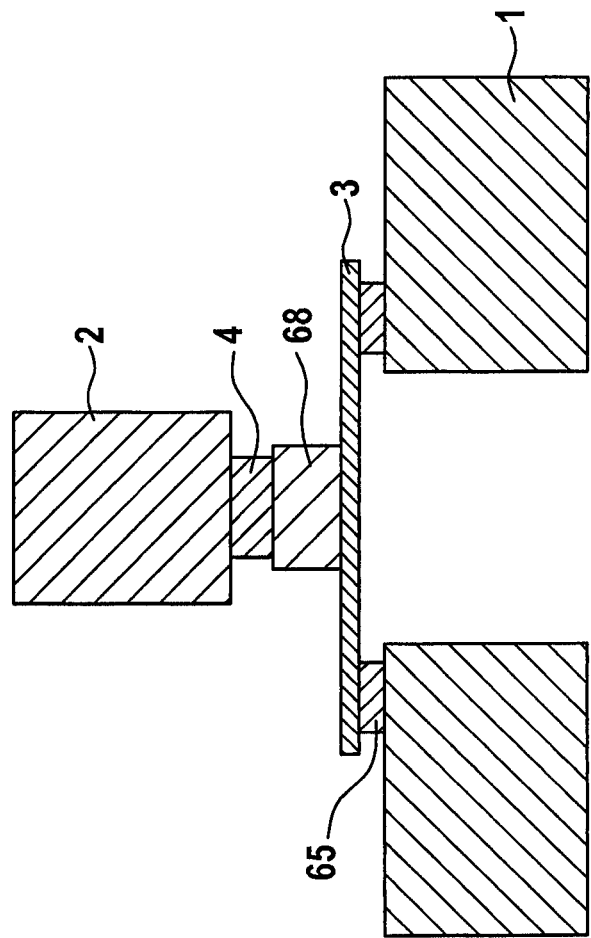
FIG. 21 shows a schematic illustration of a detail of the example of the MEMS component.
Figure 22:
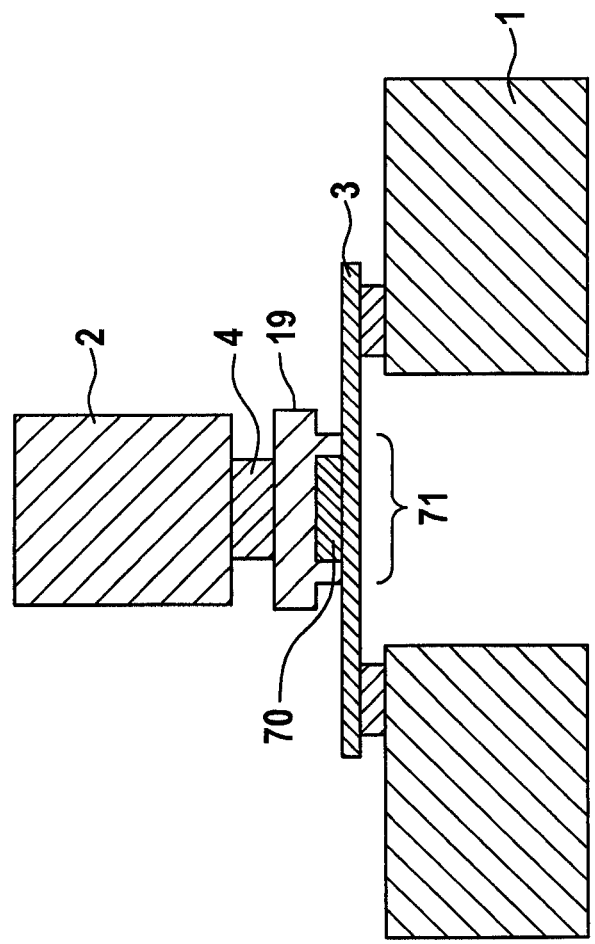
FIG. 22 shows a schematic illustration of a detail of the example of the MEMS component.

FIGS. 21 through 26 show examples of details of the coupling points of buried polysilicon layer 3 and epi-polysilicon layer 2 in the area of polysilicon diaphragms 15. FIG. 21 shows one possible coupling 65 via an oxide layer 4. Oxide layer 4 for forming an oxide bridge 68 is not completely removed between epi-polysilicon layer 2 and buried polysilicon layer 3. Another option for coupling is illustrated in FIG. 22: inner area 71 of the polysilicon diaphragm is stabilized via a reinforcing structure in polysilicon intermediate layer 19 which is strengthened by surrounding intermediate oxide layer 70. It is advantageous that the span width of the polysilicon diaphragm is defined very precisely, and temperature-dependent distortions of the polysilicon diaphragm due to the differing thermal expansion coefficients of the oxide layer and the silicon may be compensated for by thickened inner area 71.

Figure 23:
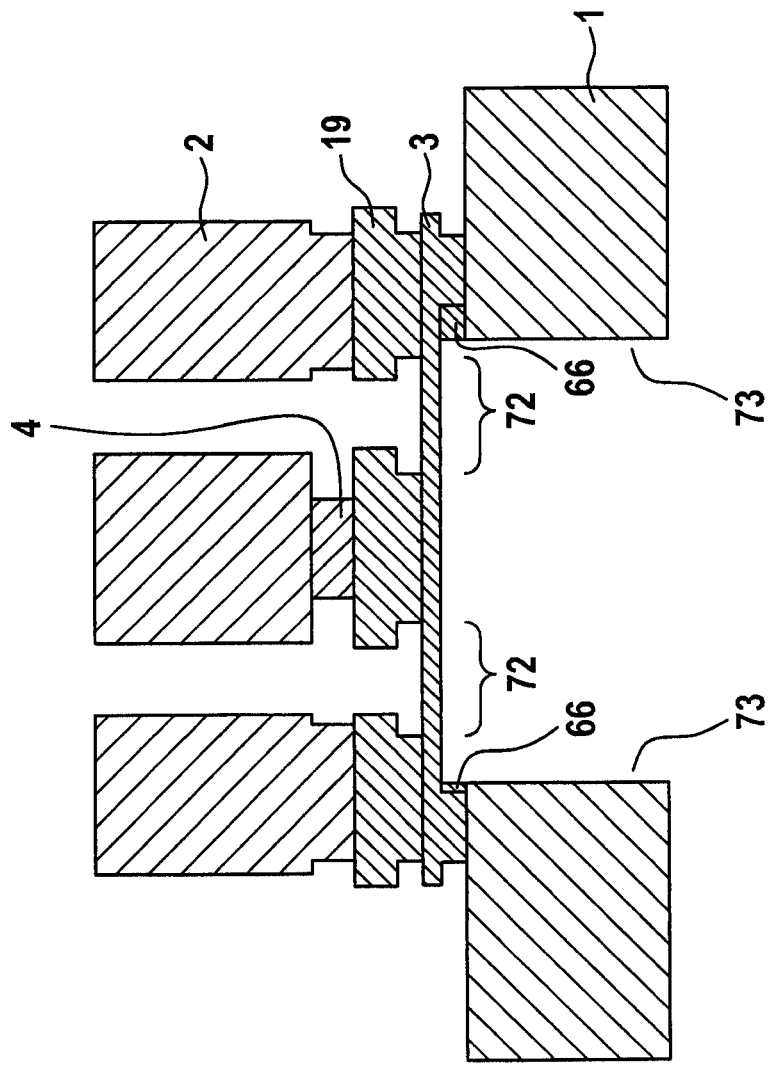
FIG. 23 shows a schematic illustration of a detail of the example of the MEMS component.
Figure 24:
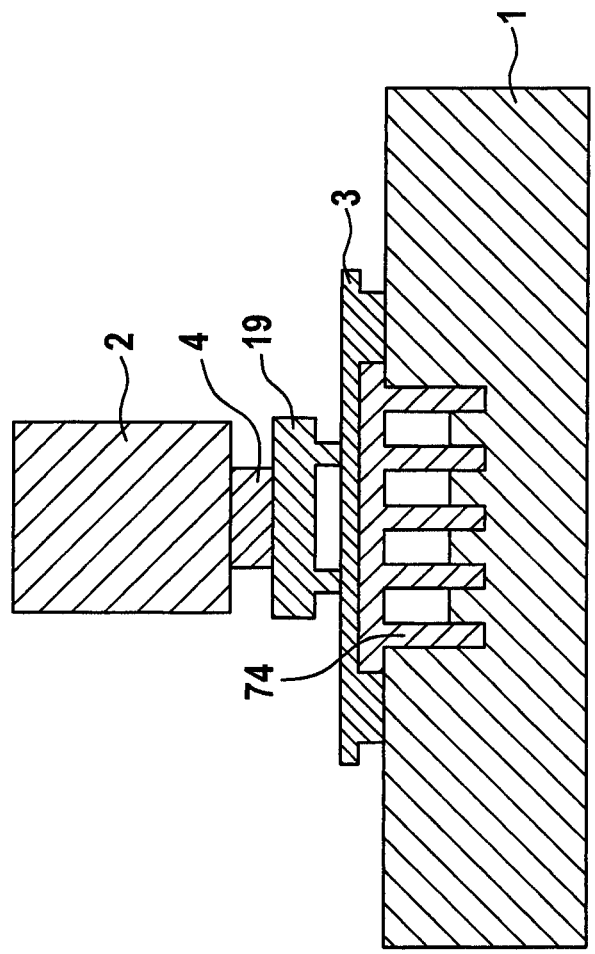
FIG. 24 shows a schematic illustration of a detail of the example of the MEMS component.
Figure 25:
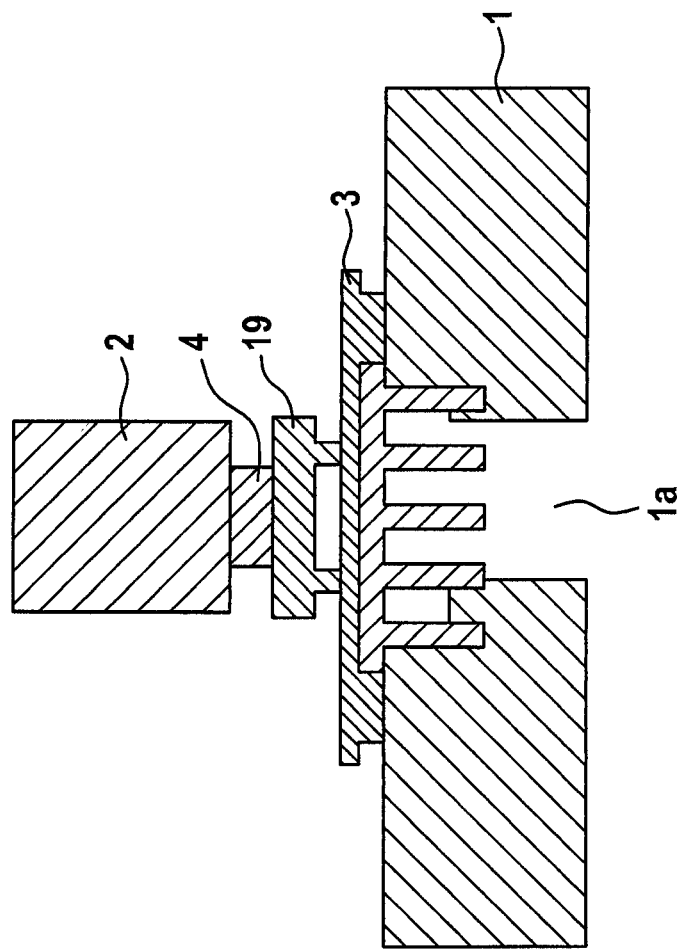
FIG. 25 shows a schematic illustration of a detail of the example of the MEMS component.
Figure 26:
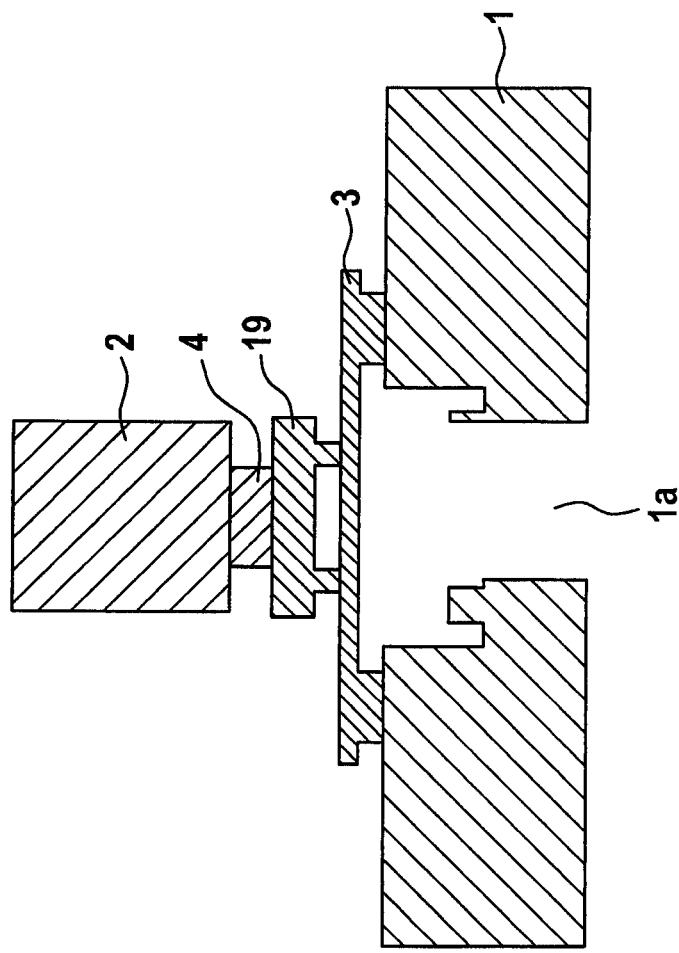
FIG. 26 shows a schematic illustration of a detail of the example of the MEMS component.

As illustrated in FIG. 23, it may prove to be advantageous to provide the thickening circumferentially in partial areas above polysilicon intermediate layer 19. Minor misadjustments 73 during the substrate etching, or oxide residues 66 from dry etching of the oxide stop layer, may thus be compensated for, since pressure-sensitive areas 72 of the polysilicon diaphragm may be moved away from misadjustments 73 or oxide residues 66 via the reinforcing structures. FIGS. 24, 25, and 26 show how, in an alternative, a misadjustment during the rear side etching of substrate 1 may likewise be compensated for with an initially applied substrate cavity 74 and a smaller rear-side etching 1a in the subsequent process. The oxide of substrate cavity 74 may be removed in an isotropic etching process.

The technology may thus also be used for producing capacitive sensor devices which include a plurality of sensitive elements for various physical sizes. The technology also allows integration of a capacitive pressure sensor, a capacitive acceleration sensor, a capacitive rotation rate sensor, and/or a magnetic field sensor on/in the same chip.

The capacitive sensor device may be operated with known capacitive evaluation circuits, for example with evaluation circuits of acceleration sensors. In particular, combined sensors may be evaluated together via a purely capacitive evaluation circuit. With a suitable design of a capacitive pressure sensor, for example the front architecture of an acceleration sensor of the same sensor device may also be used for the capacitive pressure sensor. This is easily achievable, either via multiplexing of a shared front end for pressure and acceleration, or via a further front end channel.

The advantageous capacitive sensor device may be used, for example, in an electronic multifunctional terminal, for example in a mobile telephone. In addition, the capacitive sensor devices described herein may be manufactured directly as an integrated element in combination with other sensor components, for example acceleration sensors, rotation rate sensors, magnetic field sensors, angular acceleration sensors, temperature sensors, moisture sensors, or similar types of sensors.

What is claimed is:

1. A MEMS component, comprising:
   a substrate having a cavity structured from a functional top side of the substrate;
   a buried polysilicon layer in which a polysilicon diaphragm, which at least partially spans the cavity, is exposed as a first electrode;
   an epi-polysilicon layer in which a conductive structure, which is situated at a distance above the polysilicon diaphragm by a predetermined clearance, is exposed as a second electrode; and
   an access opening which fluidically connects the external surroundings of the MEMS component to the cavity, wherein at least one access channel is formed in at least one of the buried polysilicon layer, the epi-polysilicon layer, and an inner wall of the cavity of the substrate, wherein the at least one access channel connects the access opening to the cavity, and wherein channel width of the at least one access channel is not greater than 5 µm, and wherein the at least one access channel has an aspect ratio of at least 1:4.

2. The MEMS component as recited in claim 1, wherein the at least one access channel is curved in at least one of the buried polysilicon layer, the epi-polysilicon layer, and the inner wall of the cavity of the substrate.

3. The MEMS component as recited in claim 1, wherein inner wall of the at least one access channel is coated with an organic fluorine-containing layer.

4. A manufacturing method for a MEMS component, comprising:
   structuring a cavity in a substrate from a top side of the substrate;
   exposing a polysilicon diaphragm as a first electrode above the cavity;
   exposing a conductive structure as a second electrode in an epi-polysilicon layer which is situated at a predetermined distance above the polysilicon diaphragm;
   structuring an access opening which fluidically connects the external surroundings of the MEMS component to the cavity in the substrate; and
   forming at least one access channel in at least one of the buried polysilicon layer, the epi-polysilicon layer, and an inner wall of the cavity of the substrate, wherein the at least one access channel connects the access opening to the cavity, and wherein channel width of the at least one access channel is not greater than 5 µm, and wherein the at least one access channel has an aspect ratio of at least 1:4.

* * * * *